United States Patent
Yoon et al.

(10) Patent No.: US 11,340,285 B2
(45) Date of Patent: May 24, 2022

(54) APPARATUS AND METHOD FOR DIAGNOSING WATCHDOG TIMER

(71) Applicant: LG Chem, Ltd., Seoul (KR)

(72) Inventors: Yeo-Bong Yoon, Daejeon (KR); Joong-Jae Lee, Daejeon (KR)

(73) Assignee: LG Energy Solution, Ltd.

( * ) Notice: Subject to any disclaimer, the term of this patent is extended or adjusted under 35 U.S.C. 154(b) by 377 days.

(21) Appl. No.: 16/626,064

(22) PCT Filed: Nov. 28, 2018

(86) PCT No.: PCT/KR2018/014872
§ 371 (c)(1),
(2) Date: Dec. 23, 2019

(87) PCT Pub. No.: WO2019/117512
PCT Pub. Date: Jun. 20, 2019

(65) Prior Publication Data
US 2020/0408831 A1    Dec. 31, 2020

(30) Foreign Application Priority Data

Dec. 15, 2017    (KR) .................. 10-2017-0173507

(51) Int. Cl.
*G01R 31/28*    (2006.01)
*G06F 1/24*    (2006.01)
(Continued)

(52) U.S. Cl.
CPC .......... *G01R 31/2837* (2013.01); *G06F 1/24* (2013.01); *G06F 11/0757* (2013.01); *H04B 10/802* (2013.01)

(58) Field of Classification Search
CPC .............. G01R 31/2837; G01R 31/006; G01R 31/2827; G01R 31/36; G01R 31/2836;
(Continued)

(56) References Cited

U.S. PATENT DOCUMENTS

| | | |
|---|---|---|
| 4,956,842 A | 9/1990 | Said |
| 5,522,040 A | 5/1996 | Hofsass et al. |

(Continued)

FOREIGN PATENT DOCUMENTS

| | | |
|---|---|---|
| CN | 103034509 A | 4/2013 |
| CN | 103530195 A | 1/2014 |

(Continued)

OTHER PUBLICATIONS

Chinese Search Report for Application No. 201880040958.X dated May 18, 2021, 3 pages.

(Continued)

*Primary Examiner* — Farhana A Hoque
(74) *Attorney, Agent, or Firm* — Lerner, David, Littenberg, Krumholz & Mentlik, LLP

(57) ABSTRACT

An apparatus and method for diagnosing a watchdog timer is provided. The watchdog timer is used to detect and recover from a malfunction of a battery management system. Before entering a shutdown mode in response to a shutdown command from an external device, the apparatus outputs an invalid trigger signal to the watchdog timer and diagnoses a malfunction of the watchdog timer depending on whether the watchdog timer outputs a reset signal.

10 Claims, 6 Drawing Sheets

(51) Int. Cl.
*G06F 11/07* (2006.01)
*H04B 10/80* (2013.01)

(58) Field of Classification Search
CPC ..... G01R 31/392; G06F 1/24; G06F 11/0757; G06F 11/261; G06F 11/0739; G06F 11/07; H04B 10/802; H02J 7/0029; H02J 7/0047; H01M 10/42; H01M 2010/4271; H01M 10/425; Y02E 60/10
USPC .................................................. 324/500–600
See application file for complete search history.

(56) References Cited

U.S. PATENT DOCUMENTS

| | | | |
|---|---|---|---|
| 8,909,997 | B2 | 12/2014 | Fuchigami |
| 9,229,521 | B2 | 1/2016 | Furuya et al. |
| 2003/0079163 | A1 | 4/2003 | Hashimoto et al. |
| 2003/0141997 | A1 | 7/2003 | Kawabe et al. |
| 2005/0077878 | A1 | 4/2005 | Carrier et al. |
| 2011/0140669 | A1* | 6/2011 | Murakami ............ H02J 7/0026 320/134 |
| 2011/0156618 | A1 | 6/2011 | Seo et al. |
| 2013/0091323 | A1 | 4/2013 | Kanamori |
| 2013/0231807 | A1 | 9/2013 | Yoshikawa et al. |
| 2014/0013150 | A1 | 1/2014 | Kaltenegger et al. |
| 2016/0132378 | A1 | 5/2016 | Jung et al. |

FOREIGN PATENT DOCUMENTS

| | | |
|---|---|---|
| CN | 203838691 U | 9/2014 |
| CN | 105988884 A | 10/2016 |
| JP | H04268646 A | 9/1992 |
| JP | H11167505 A | 6/1999 |
| JP | H11175371 A | 7/1999 |
| JP | 2000104622 A | 4/2000 |
| JP | 2002278657 A | 9/2002 |
| JP | 1432354 B2 | 3/2010 |
| JP | 2011127669 A | 6/2011 |
| JP | 2011127969 A | 6/2011 |
| JP | 2011155829 A | 8/2011 |
| JP | 5167521 B2 | 3/2013 |
| JP | 201362981 A | 4/2013 |
| JP | 2013182477 A | 9/2013 |
| KR | 100363572 B1 | 12/2002 |
| KR | 20030065369 A | 8/2003 |
| KR | 20120013504 A | 2/2012 |

OTHER PUBLICATIONS

European Search Reoport for Application No. EP18887958.9, dated Nov. 16, 2020, 5 pages.
International Search Report for Application No. PCT/KR2018/014872 dated Mar. 19, 2019, 2 pages.

* cited by examiner

APPARATUS AND METHOD FOR DIAGNOSING WATCHDOG TIMER

CROSS-REFERENCE TO RELATED APPLICATIONS

The present application is a national phase entry under 35 U.S.C. § 371 of International Application No. PCT/KR2018/014872 filed Nov. 28, 2018, published in Korean, which claims priority from Korean Patent Application No. 10-2017-0173507, filed Dec. 15, 2017, all of which are incorporated herein by reference.

TECHNICAL FIELD

The present disclosure relates to an apparatus and method for diagnosing a watchdog timer, and more particularly, to an apparatus and method for diagnosing the operating condition of the watchdog timer that detects a malfunction of a battery management system and recovers the malfunction of the battery management system.

The present application claims priority to Korean Patent Application No. 10-2017-0173507 filed in the Republic of Korea on Dec. 15, 2017, the disclosures of which are incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

It is general that a battery pack mounted in electric vehicles includes at least one battery module. In this instance, each battery module includes one battery cell or two or more battery cells connected in series.

The state of each battery module included in the battery pack is monitored by a battery management system (BMS). The BMS may output signals for controlling the balancing operation, cooling operation, charging operation and discharging operation based on the monitored parameters (e.g., voltage, current, temperature) from each battery module.

Meanwhile, a defect in hardware or an error in software may lead to occasional malfunction of the BMS. The malfunction of the BMS may cause a grave safety problem, and a watchdog timer is used to detect the malfunction of the BMS and recover the BMS from the malfunction. However, when the watchdog timer operates incorrectly, it is impossible to detect the malfunction of the BMS, or even though the malfunction of the BMS is detected, the watchdog timer cannot recover the BMS from the malfunction.

SUMMARY

Technical Problem

The present disclosure is designed to solve the above-described problem, and therefore, the present disclosure is directed to providing an apparatus and method for diagnosing a malfunction of a watchdog timer used to detect and recover from a malfunction of a battery management system included in a battery pack.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

Technical Solution

Various embodiments of the present disclosure for achieving the above-described object are as follows.

An apparatus for diagnosing a watchdog timer according to an embodiment of the present disclosure includes a DC-DC voltage converter including an enable terminal, a power input terminal and a power output terminal and configured to selectively output an operating voltage for the watchdog timer at the power output terminal based on an input voltage applied to the power input terminal, and a control unit including a first communication terminal, a hold terminal, a trigger terminal and a reset terminal. The hold terminal is electrically connected to the enable terminal. The control unit is configured to output a hold signal from the hold terminal and an invalid trigger signal from the trigger terminal when a first control signal that commands a shutdown of the control unit is applied to the first communication terminal. The invalid trigger signal causes the watchdog timer to output a reset signal to the reset terminal. The DC-DC voltage converter is configured to output the operating voltage from the power output terminal while the hold signal is outputted to the enable terminal. The control unit is configured to store diagnosis data indicating a malfunction of the watchdog timer in a memory when the reset signal is not applied onto the reset terminal within a preset threshold time from when the invalid trigger signal is outputted from the trigger terminal.

After the diagnosis data is stored in the memory, the control unit may be configured to stop outputting the hold signal to enter a shutdown mode in response to the first control signal. The DC-DC voltage converter may be configured to stop outputting the operating voltage from the power output terminal in response to the output of the hold signal to the enable terminal being stopped.

The control unit may further include a second communication terminal. The control unit may output to the second communication terminal a diagnosis signal corresponding to the diagnosis data when a second control signal that commands a wakeup of the control unit is applied to the first communication terminal.

The watchdog timer may be a window watchdog timer. In this case, the invalid trigger signal may include at least a first trigger pulse and a second trigger pulse. A time interval between the first trigger pulse and the second trigger pulse may be shorter than a minimum time interval that is preset for the window watchdog timer.

The apparatus for diagnosing a watchdog timer may further include an opto-coupler. The opto-coupler may be installed between an external device and the first communication terminal. The opto-coupler may be configured to convert a shutdown command from the external device to the first control signal.

A battery management system according to another embodiment of the present disclosure includes the apparatus for diagnosing a watchdog timer of any of the embodiments described herein.

A battery pack according to still another embodiment of the present disclosure includes the battery management system.

A method for diagnosing a watchdog timer according to yet another embodiment of the present disclosure uses a diagnosis apparatus including a DC-DC voltage converter including an enable terminal, a power input terminal and a power output terminal and configured to output an operating voltage for the watchdog timer from the power output terminal based on an input voltage applied to the power input terminal, and a control unit including a first communication terminal, a hold terminal, a trigger terminal and a reset terminal. The hold terminal is electrically connected to the enable terminal. The method includes outputting, by the control unit, a hold signal from the hold terminal when a first control signal that commands a shutdown of the control unit is applied to the first communication terminal, outputting, by the DC-DC voltage converter, the operating voltage from the power output terminal while the hold signal is applied to the enable terminal, outputting, by the control unit, an invalid trigger signal from the trigger terminal while the hold signal is outputted from the hold terminal. The invalid trigger signal causes the watchdog timer to output a reset signal to the reset terminal. The method further includes storing, by the control unit, diagnosis data indicating a malfunction of the watchdog timer in a memory when the reset signal is not applied to the reset terminal within a preset threshold time from when the invalid trigger signal is outputted from the trigger terminal.

The watchdog timer may be a window watchdog timer. The invalid trigger signal may include at least a first trigger pulse and a second trigger pulse. A time interval between the first trigger pulse and the second trigger pulse may be shorter than a minimum time interval that is preset for the window watchdog timer.

Advantageous Effects

According to at least one of the embodiments of the present disclosure, it is possible to diagnose a maloperation of a watchdog timer used to detect a malfunction of a battery management system included in a battery pack and recover the battery management system from the malfunction.

In particular, the maloperation diagnosis for the watchdog timer is performed only when a shutdown command is received from an external device, to prevent a risk that power supply from the battery pack to a load is abruptly stopped due to the watchdog timer diagnosis.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus, the present disclosure should not be construed as limited to the drawings.

DETAILED DESCRIPTION

Figure 1:
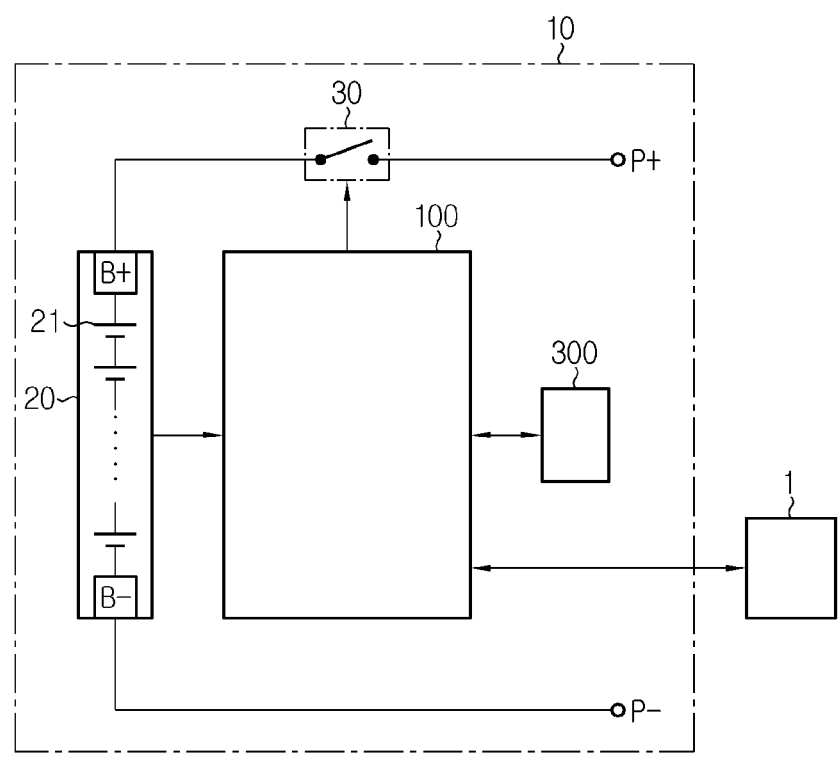
FIG. 1 is a diagram showing the functional configuration of a battery pack according to an embodiment of the present disclosure.

Hereinafter, preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term "control unit" as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

FIG. 1 is a diagram showing the configuration of a battery pack 10 according to an embodiment of the present disclosure.

Referring to FIG. 1, the battery pack 10 includes a battery module 20, a contactor 30, a battery management system (BMS) 100 and a watchdog timer 300.

The battery module 20 includes a positive terminal B+, a negative terminal B− and at least one battery cell 21. When the battery module 20 includes a plurality of battery cells 21, the plurality of battery cells 21 may be connected in series and/or in parallel. Typically, the battery cell 21 may include a lithium ion battery, a lithium polymer battery, a nickel cadmium battery, a nickel hydrogen battery and a nickel zinc battery. Of course, the cell type is not limited to the types listed above, and includes any type of cell that can be repeatedly charged and discharged.

The contactor 30 is installed on a high current path of the battery pack 10 to control the charge/discharge current of the battery pack 10. The high current path of the battery pack 10 may include a channel between the positive terminal B+ of the battery module 20 and a positive terminal P+ of the battery pack 10 and a channel between the negative terminal B− of the battery module 20 and a negative terminal P− of the battery pack 10. Although FIG. 1 shows the contactor 30 installed between the positive terminal P+ of the battery pack 10 and the positive terminal B+ of the battery module 20, the installation location of the contactor 30 is not limited thereto. For example, the contactor 30 may be installed between the negative terminal P− of the battery pack 10 and the negative terminal B− of the battery module 20.

The contactor 30 may open and close the flow of current through the battery module 20 when the contactor 30 is turned on or off in response to a switching signal from the BMS 100.

The BMS 100 may be operably coupled to the battery module 20 and the contactor 30 to individually control the operation of the battery module 20 and the contactor 30. The BMS 100 is configured to individually measure the voltage, current and/or temperature of the battery module 20, and selectively perform at least one of a variety of preset functions (e.g., cell balancing, charging, discharging) based on the measured voltage, current and/or temperature.

The watchdog timer 300 is operably coupled to the BMS 100. The watchdog timer 300 operates using the operating power supplied from the BMS 100. During operation of the watchdog timer 300, the watchdog timer 300 repeatedly monitors whether the BMS 100 malfunctions. When a malfunction of the BMS 100 is monitored by the watchdog timer 300, the watchdog timer 300 recovers the BMS 100 from the malfunction by resetting the BMS 100. Resetting the BMS 100 may mean resetting a control unit 220 described below.

Figure 2:
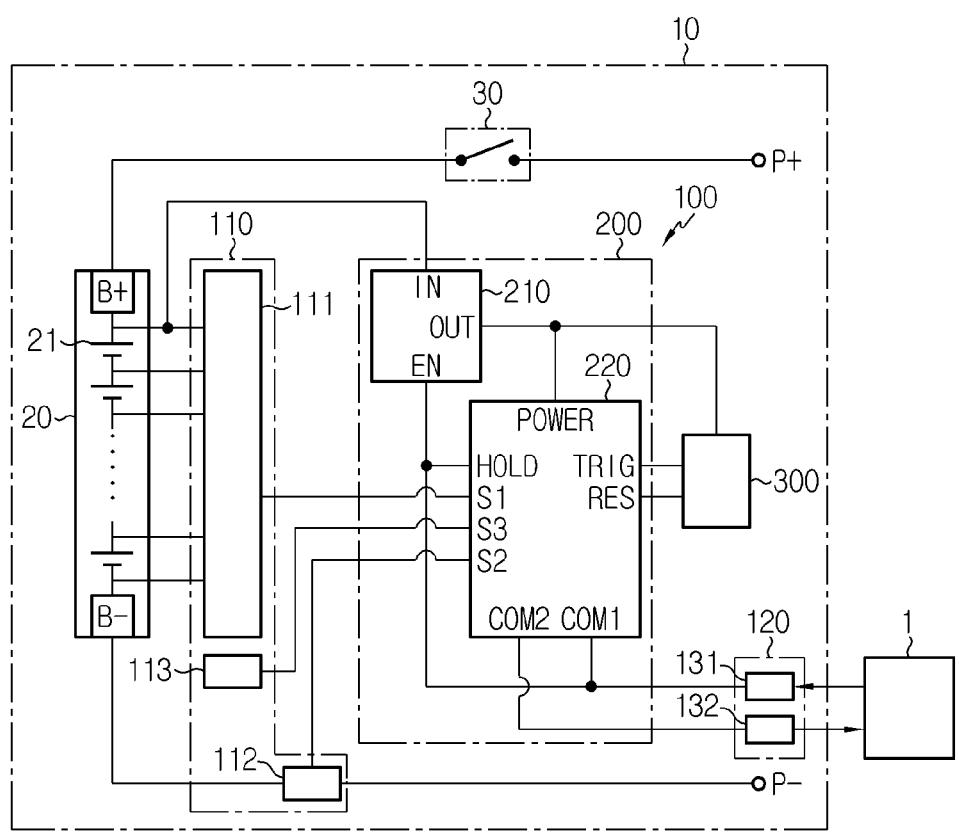
FIG. 2 is a diagram showing the functional configuration of a battery management system of FIG. 1.

FIG. 2 is a detailed diagram showing the configuration of the battery pack 10 of FIG. 1.

Referring to FIG. 2, the BMS 100 includes a sensing unit 110, a communication unit 120 and a diagnosis apparatus 200.

The sensing unit 110 is configured to measure the operation parameters of the battery module 20. To this end, the sensing unit 110 includes at least one of a voltage sensor 111, a current sensor 112 and a temperature sensor 113. The voltage sensor 111 is configured to measure the terminal voltage of the battery module 20 and/or the cell voltage of each battery cell included in the battery module 20. The terminal voltage of the battery module 20 corresponds to a potential difference between the positive terminal B+ and the negative terminal B− of the battery module 20. The current sensor 112 may be electrically connected in series to the contactor 30, and is configured to measure the current flowing through the high current path of the battery pack 10. The temperature sensor 113 is configured to measure the temperature of the battery module 20. The sensing unit 110 may transmit a sensing signal indicating the periodically measured terminal voltage, cell voltage, current and/or temperature to the diagnosis apparatus 200.

The communication unit 120 is configured to support bidirectional communication between an external device 1 (e.g., an ECU of an electric vehicle) and the BMS 100. The communication unit 120 may be installed between the external device 1 and the BMS 100 for electrical insulation between the external device 1 and the BMS 100.

The communication unit 120 may include a first photo relay 131. The first photo relay 131 includes a first light source and a first photodetector, and converts commands transmitted from the external device 1 to the BMS 100 into signals in a form that can be recognized by the BMS 100. Specifically, the first light source converts each command transmitted from the external device 1 to its corresponding optical signal and outputs the same. The first photodetector generates a control signal corresponding to the optical signal in response to the optical signal outputted from the first light source. The control signal generated by the first photodetector is applied onto a first communication terminal COM1 of a control unit 220 described below. In an example, the first photo relay 131 may convert a shutdown command from the external device 1 to a first control signal. In another example, the first photo relay 131 may convert a wakeup command from the external device 1 to a second control signal. The shutdown command induces the BMS 100 to enter a shutdown mode from a wakeup mode. The wakeup command induces the BMS 100 to enter the wakeup mode from the shutdown mode. In the shutdown mode, the power consumption by the BMS 100 is stopped. On the contrary, in the wakeup mode, the BMS 100 operates using the power supplied from the battery module 20 or an external power source.

The communication unit 120 may further include a second photo relay 132. The second photo relay 132 includes a second light source and a second photodetector, and converts messages transmitted from the BMS 100 to the external device 1 into signals in a form that can be recognized by the external device 1. Specifically, the second light source converts each message transmitted from the BMS 100 to its corresponding optical signal and outputs the same. The second photodetector generates a notification signal corresponding to the optical signal in response to the optical signal outputted from the second light source.

Each of the above-described first and second photo relays 131, 132 may include, for example, an opto-coupler.

Of course, the communication unit 120 may include other types of communication circuits that support bidirectional communication with the external device 1 in place of the first and second photo relays 131, 132.

The diagnosis apparatus 200 may individually perform the diagnosis operation for the battery module 20 and the diagnosis operation for the watchdog timer 300. For example, the diagnosis apparatus 200 may repeatedly monitor whether the watchdog timer 300 operates normally while monitoring the overvoltage, overcharge and/or overdischarge of the battery module 20.

The diagnosis apparatus 200 includes a DC-DC voltage converter 210 and a control unit 220. The control unit 220 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The control unit 220 may have a memory embedded therein. The memory may additionally store data, instructions and software required for the overall operation of the BMS 100. The memory may include at least one type of storing medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM), and programmable read-only memory (PROM).

The DC-DC voltage converter 210 includes an enable terminal EN, a power input terminal IN and a power output terminal OUT. The power input terminal IN receives an input voltage from the battery module 20 or the external power source (e.g., an auxiliary battery of the electric vehicle). That is, the input voltage from the battery module 20 or the external power source is applied to the power input terminal IN.

The power output terminal OUT outputs the operating voltage generated from the input voltage. That is, the DC-DC voltage converter 210 may generate the operating voltage using the input voltage applied to the power input terminal IN, and output the generated operating voltage to the power output terminal OUT. The operating voltage outputted to the power output terminal OUT is for the watchdog timer 300. Of course, the watchdog timer 300 as well as at least one of the sensing unit 110, the communication unit 120 and the control unit 220 may operate using the operating voltage from the DC-DC voltage converter 210.

The enable terminal EN is operably coupled to the control unit 220 described below. The DC-DC voltage converter 210 may output the operating voltage onto the power output terminal OUT or stop outputting the operating voltage in response to a signal applied to the enable terminal EN from the control unit 220. Specifically, the DC-DC voltage converter 210 may output the operating voltage at the power output terminal OUT only when the voltage of the signal applied to the enable terminal EN is equal to or higher than a threshold voltage (e.g., 3V).

The control unit 220 may perform the diagnosis operation for the battery module 20 based on the sensing signals from the sensing unit 110. For example, the control unit 220 may estimate the state-of-charge (SOC) of each battery cell 21 based on the cell voltage and the current measured by the sensing unit 110. In another example, when the SOC of at least one battery cell 21 is outside of a preset range, the control unit 220 may turn off the contactor 30 to prevent the charge or discharge of the battery module 20.

The control unit 220 may execute the diagnosis operation for the watchdog timer 300. The control unit 220 includes a power input terminal POWER, a first communication terminal COM1, a hold terminal HOLD, a trigger terminal TRIG and a reset terminal RES, and may further include a second communication terminal COM2.

The power input terminal POWER is electrically connected to the power output terminal OUT of the DC-DC voltage converter 210 to receive the operating voltage outputted through the power output terminal OUT. The control unit 220 may operate using the operating voltage received by the power input terminal POWER.

The first communication terminal COM1 receives control signals from the communication unit 120. When the first control signal is applied to the first communication terminal COM1 through the communication unit 120, the control unit 220 may execute the diagnosis operation for the watchdog timer 300. As described above, the first control signal is associated with the shutdown command from the external device 1, and may be a signal that commands a shutdown of the control unit 220.

The hold terminal HOLD is electrically connected to the enable terminal EN, and selectively outputs a hold signal. The hold terminal HOLD may be also electrically connected to the first communication terminal COM1 in common. In response to the first control signal, the control unit 220 may continuously output the hold signal to the hold terminal HOLD for at least a preset reference time, and then the control unit 220 may enter the shutdown mode. As shown, the hold terminal HOLD is electrically connected to the enable terminal EN of the DC-DC voltage converter 210. The voltage of the hold signal may be equal to or higher than the threshold voltage (e.g., 3V). The DC-DC voltage converter 210 may continuously output the operating voltage generated using the input voltage onto the power output terminal OUT while the hold signal of the threshold voltage (e.g., 3V) or higher is outputted to the enable terminal EN. Accordingly, the watchdog timer 300 may operate using the operating voltage from the DC-DC voltage converter 210 for at least the preset reference time from the last time point when the first control signal is applied to the first communication terminal COM1.

The trigger terminal TRIG selectively outputs a valid trigger signal or an invalid trigger signal. The valid trigger signal is to notify that the control unit 220 is in normal operation to the watchdog timer 300. That is, the watchdog timer 300 may recognize that the control unit 220 is in normal operation when the valid trigger signal is outputted through the trigger terminal TRIG. The invalid trigger signal is to notify that the control unit 220 is in abnormal operation to the watchdog timer 300, and induces the watchdog timer 300 to output a reset signal (e.g., 0V) to the reset terminal RES.

The control unit 220 may output the valid trigger signal to the trigger terminal TRIG until the first control signal is applied to the first communication terminal COM1. On the contrary, the control unit 220 may output the invalid trigger signal to the trigger terminal TRIG when the first control signal is applied to the first communication terminal COM1. The watchdog timer 300 in normal operation does not output the reset signal while the valid trigger signal is outputted through the trigger terminal TRIG. On the contrary, the watchdog timer 300 in normal operation outputs the reset signal when the valid trigger signal is not outputted at the trigger terminal TRIG for a preset timeout period or longer or the invalid trigger signal is outputted at the trigger terminal TRIG. When the watchdog timer 300 operates abnormally, even though the invalid trigger signal is outputted through the trigger terminal TRIG, the watchdog timer 300 cannot output the reset signal to the reset terminal RES of the control unit 220.

The reset terminal RES receives the reset signal from the watchdog timer 300. The control unit 220 is reset in response to the reset signal from the watchdog timer 300 received through the reset terminal RES.

The second communication terminal COM2 outputs a message to the external device 1. The control unit 220 may output a message representing the result of diagnosis for the watchdog timer 300 to the second communication terminal COM2. The message outputted through the second communication terminal COM2 is converted by the second photo relay 132 into the notification signal in a form that can be recognized by the external device 1.

The control unit 220 may further include sensing terminals S1, S2, S3 to receive the sensing signals from the sensing unit 110.

Figure 3:
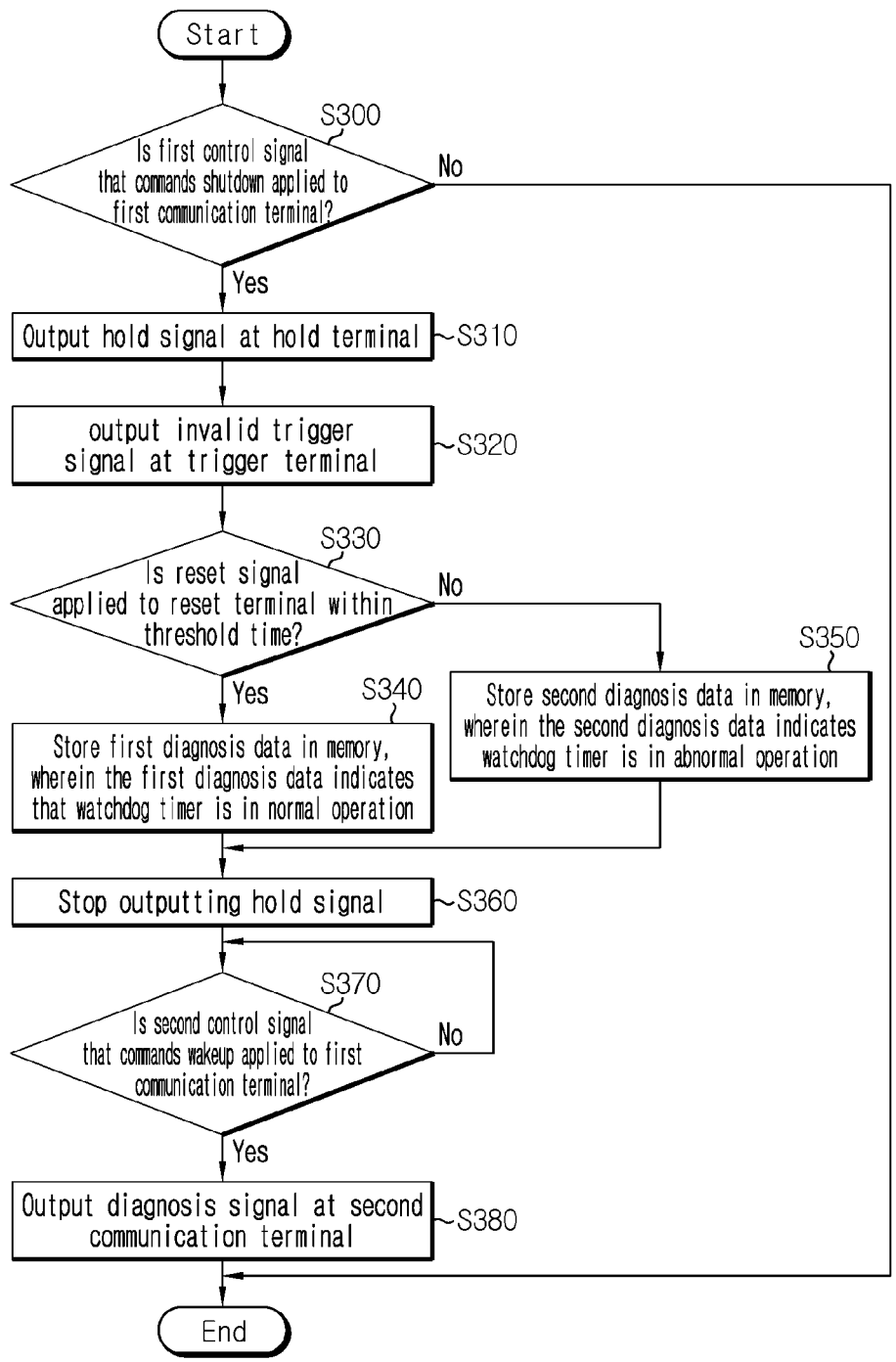
FIG. 3 is a flowchart showing a method for diagnosing a watchdog timer according to another embodiment of the present disclosure.

FIG. 3 is a flowchart showing a method for diagnosing the watchdog timer 300 according to another embodiment of the present disclosure. Assume that the control unit 220 operates normally in a wakeup mode before the start of the method according to FIG. 3.

Referring to FIGS. 1 to 3, in the step S300, the control unit 220 determines whether a first control signal that commands the shutdown of the control unit 220 is applied to the first communication terminal COM1. When the result of the step S300 is "YES", the step S310 is performed.

In the step S310, the control unit 220 outputs a hold signal at the hold terminal HOLD to enable the DC-DC voltage converter 210 to output the operating voltage to the watchdog timer 300. The hold signal is a signal that induces the DC-DC voltage converter 210 to output the operating voltage, and is transmitted to the enable terminal EN of the DC-DC voltage converter 210 electrically connected to the hold terminal HOLD. Accordingly, the DC-DC voltage converter 210 outputs the operating voltage at the power output terminal OUT while the hold signal is applied to the enable terminal EN. The operating voltage outputted in the step S310 is used for the operation of the watchdog timer 300.

In the step S320, the control unit 220 outputs the invalid trigger signal from the trigger terminal TRIG while the hold signal is outputted at the hold terminal HOLD (i.e., while the operating voltage is provided to the watchdog timer 300). The invalid trigger signal is a signal that induces the watchdog timer 300 to output the reset signal to the reset terminal RES.

In the step S330, the control unit 220 determines whether the reset signal is applied to the reset terminal RES within a preset threshold time from the time point when the invalid trigger signal is outputted at the trigger terminal TRIG. The preset threshold time may be equal to or shorter than the reference time. When the result of the step S330 is "YES", the step S340 is performed. When the result of the step S330 is "NO", the step S350 is performed.

In the step S340, the control unit 220 stores first diagnosis data in the memory. The first diagnosis data indicates that the watchdog timer 300 is in normal operation In the step S350, the control unit 220 stores second diagnosis data in the memory. The second diagnosis data indicates that the watchdog timer 300 is in abnormal operation.

In the step S360, the control unit 220 stops outputting the hold signal to enter the shutdown mode in response to the first control signal. The DC-DC voltage converter 210 stops outputting the operating voltage from the power output terminal OUT in response to the output of the hold signal to the enable terminal EN being stopped. Accordingly, the control unit 220 enters the shutdown mode. The shutdown mode is a mode for preventing or reducing the power consumption by the BMS 100. That is, in the shutdown mode, the diagnosis apparatus 200 as well as the sensing unit 110 and the communication unit 120 may stop operating.

In the step S370, in the shutdown mode, the control unit 220 determines whether a second control signal that commands a wakeup of the control unit 220 is applied to the first communication terminal COM1. The second control signal may be applied to the first communication terminal COM1 of the control unit 220 and the enable terminal EN of the DC-DC voltage converter 210 in common. The DC-DC voltage converter 210 outputs the operating voltage to the voltage output terminal OUT in response to the second control signal. The control unit 220 may determine whether the second control signal is applied to the first communication terminal COM1 by the operation using the operating voltage temporarily outputted from the DC-DC voltage converter 210 in response to the second control signal applied to the enable terminal EN. When the result of the step S370 is "YES", the step S380 is performed.

In the step S380, the control unit 220 enters the wakeup mode and outputs a diagnosis signal indicating the first diagnosis data or the second diagnosis data stored in the memory from the second communication terminal COM2. Accordingly, the control unit 220 may notify normal operation or malfunction of the watchdog timer 300 to the external device 1.

Figure 4:
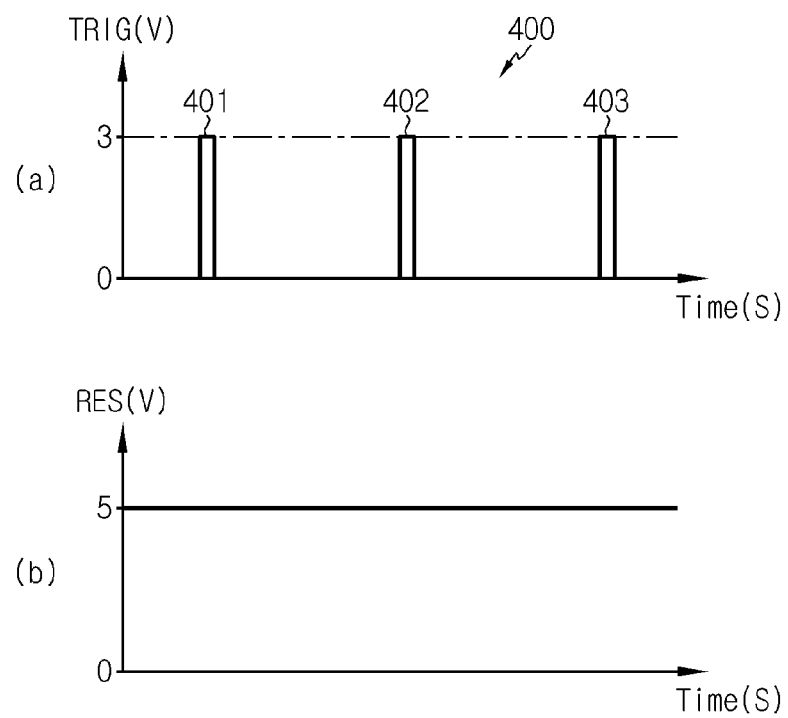
FIGS. 4 and 5 are timing charts showing the operation of a standard watchdog timer that can be used as a watchdog timer of FIG. 2.
Figure 5:
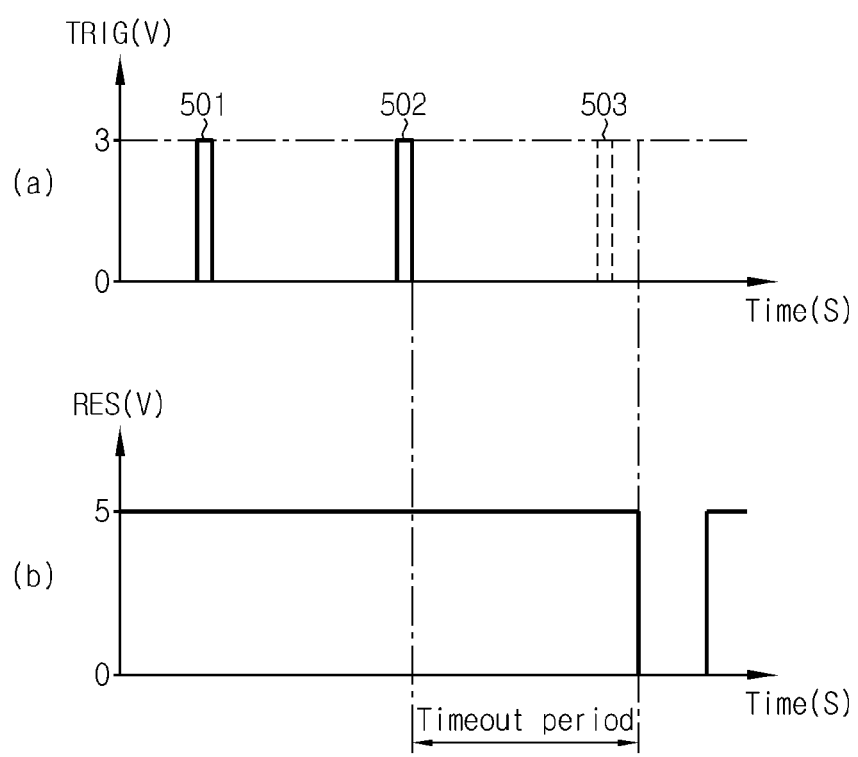

FIGS. 4 and 5 are timing charts showing the operation of a standard watchdog timer that can be used as the watchdog timer 300 of FIG. 2.

The standard watchdog timer is cleared in response to a trigger pulse generated within the preset timeout period, and outputs a reset signal when a trigger pulse is not received within the timeout period.

Referring to FIG. 4, the control unit 220 that operates normally in the wakeup mode may output a valid trigger signal 400 at the trigger terminal TRIG. The valid trigger signal 400 may include trigger pulses 401, 402, 403 having a preset high level of voltage (e.g., 3V). A time interval between two adjacent trigger pulses (e.g., 402 and 403) included in the valid trigger signal 400 is shorter than the timeout period of the standard watchdog timer, thereby preventing the timeout of the standard watchdog timer. While there is no timeout, the standard watchdog timer may output a preset high level of voltage (e.g., 5V) to the reset terminal RES of the control unit 220 to prevent the control unit 220 from being reset undesirably.

On the contrary, referring to FIG. 5, the malfunction of the control unit 220 may cause a so-called 'late fault' whereby the trigger pulse from the control unit 220 is interrupted longer than the timeout period. For example, when the late fault of the control unit 220 such as missing of trigger pulse 503 of FIG. 5 occurs, the standard watchdog timer outputs a reset signal (e.g., 0V) to the reset terminal RES of the control unit 220.

Figure 6:
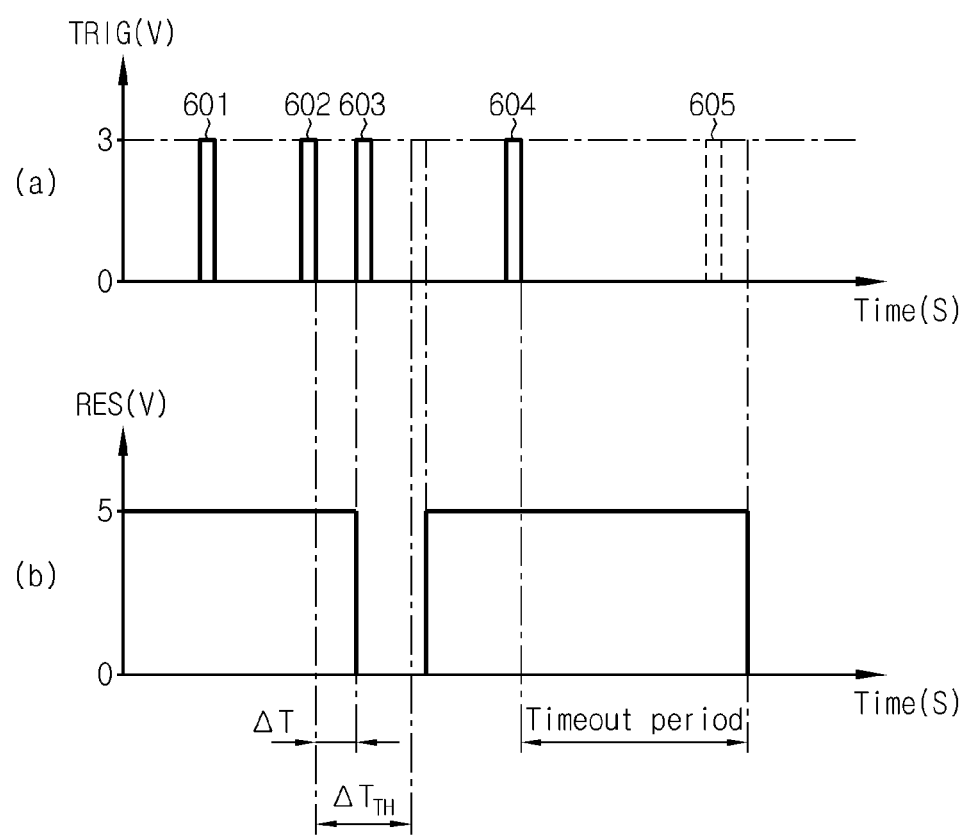
FIG. 6 is a timing chart showing the operation of a window watchdog timer that can be used as a watchdog timer of FIG. 2.

FIG. 6 is a timing chart showing the operation of a window watchdog timer that can be used as the watchdog timer 300 of FIG. 2.

The window watchdog timer may detect an occurrence of the above-described late fault like the standard watchdog timer. Further, the window watchdog timer can detect a so-called 'fast fault' as well, so the window watchdog timer is an improved watchdog timer over the standard watchdog timer.

Referring to FIG. 6, the window watchdog timer may detect a time interval between trigger pulses 601, 602, 603, 604, 605 outputted in a sequential order by the control unit 220. As shown, a time interval $\Delta T$ between the trigger pulse 602 and the trigger pulse 603 shorter than a minimum time interval $\Delta T_{TH}$ that is preset for the window watchdog timer may mean that fast fault of the control unit 220 occurred. When the fast fault of the control unit 220 occurs, the window watchdog timer outputs a reset signal (e.g., 0V) to the reset terminal RES of the control unit 220. The above-described invalid trigger signal may be a signal including at least two trigger pulses, the time interval $\Delta T$ between which the trigger pulses is shorter than the minimum time interval $\Delta T_{TH}$, like the trigger pulse 602 and the trigger pulse 603.

Meanwhile, due to missing of the trigger pulse 605, when the late fault of the control unit 220 occurs whereby there is no trigger pulse during the timeout period from the end time of the previous trigger pulse 604, the window watchdog timer outputs a reset signal (e.g., 0V) to the reset terminal RES of the control unit 220.

The embodiments of the present disclosure described hereinabove are not implemented only through the apparatus and method, and may be implemented through programs that realize functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for diagnosing a watchdog timer, comprising:
    a DC-DC voltage converter including an enable terminal, a power input terminal and a power output terminal, and configured to selectively output an operating voltage for the watchdog timer at the power output terminal based on an input voltage applied to the power input terminal; and
    a control unit including a first communication terminal, a hold terminal, a trigger terminal and a reset terminal, wherein the hold terminal is electrically connected to the enable terminal,
    wherein the control unit is configured to output a hold signal from the hold terminal and an invalid trigger signal from the trigger terminal when a first control signal that commands a shutdown of the control unit is applied to the first communication terminal, wherein the invalid trigger signal causes the watchdog timer to output a reset signal to the reset terminal,
    wherein the DC-DC voltage converter is configured to output the operating voltage from the power output terminal while the hold signal is outputted to the enable terminal, and
    wherein the control unit is configured to store diagnosis data indicating a malfunction of the watchdog timer in a memory when the reset signal is not applied to the reset terminal within a preset threshold time from when the invalid trigger signal is outputted from the trigger terminal.

2. The apparatus for diagnosing a watchdog timer according to claim 1, wherein after storing the diagnosis data in the memory, the control unit is configured to stop outputting the hold signal to enter a shutdown mode in response to the first control signal, and
    wherein the DC-DC voltage converter is configured to stop outputting the operating voltage from the power output terminal in response to the output of the hold signal to the enable terminal being stopped.

3. The apparatus for diagnosing a watchdog timer according to claim 1, wherein the control unit further includes a second communication terminal, and is configured to output to the second communication terminal a diagnosis signal corresponding to the diagnosis data when a second control signal that commands a wakeup of the control unit is applied to the first communication terminal.

4. The apparatus for diagnosing a watchdog timer according to claim 1, wherein the watchdog timer is a window watchdog timer.

5. The apparatus for diagnosing a watchdog timer according to claim 4, wherein the invalid trigger signal includes at least a first trigger pulse and a second trigger pulse, and
    a time interval between the first trigger pulse and the second trigger pulse is shorter than a minimum time interval that is preset for the window watchdog timer.

6. The apparatus for diagnosing a watchdog timer according to claim 1, further comprising:
    an opto-coupler installed between an external device and the first communication terminal, wherein the opto-coupler is configured to convert a shutdown command from the external device to the first control signal.

7. A battery management system comprising the apparatus for diagnosing a watchdog timer according to claim 1.

8. A battery pack comprising the battery management system according to claim 7.

9. A method for diagnosing a watchdog timer, using a diagnosis apparatus including:
    a DC-DC voltage converter including an enable terminal, a power input terminal and a power output terminal, and configured to output an operating voltage for the watchdog timer from the power output terminal based on an input voltage applied to the power input terminal; and
    a control unit including a first communication terminal, a hold terminal electrically connected to the enable terminal, a trigger terminal and a reset terminal,
    wherein the method for diagnosing a watchdog timer comprises:
    outputting, by the control unit, a hold signal from the hold terminal when a first control signal that commands a shutdown of the control unit is applied to the first communication terminal;
    outputting, by the DC-DC voltage converter, the operating voltage from the power output terminal while the hold signal is applied to the enable terminal;
    outputting, by the control unit, an invalid trigger signal from the trigger terminal while the hold signal is outputted from the hold terminal, wherein the invalid trigger signal causes the watchdog timer to output a reset signal to the reset terminal; and
    storing, by the control unit, diagnosis data indicating a malfunction of the watchdog timer in a memory when the reset signal is not applied to the reset terminal within a preset threshold time from when the invalid trigger signal is outputted from the trigger terminal.

10. The method for diagnosing a watchdog timer according to claim 9, wherein the watchdog timer is a window watchdog timer,
    wherein the invalid trigger signal includes at least a first trigger pulse and a second trigger pulse, and
    wherein a time interval between the first trigger pulse and the second trigger pulse is shorter than a minimum time interval that is preset for the window watchdog timer.

* * * * *